United States Patent
Pandey et al.

(10) Patent No.: US 10,236,213 B1
(45) Date of Patent: Mar. 19, 2019

(54) GATE CUT STRUCTURE WITH LINER SPACER AND RELATED METHOD

(71) Applicant: GLOBALFOUNDRIES INC., Grand Cayman (KY)

(72) Inventors: Shesh M. Pandey, Saratoga Springs, NY (US); Jiehui Shu, Clifton Park, NY (US); Hui Zang, Guilderland, NY (US); Laertis Economikos, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/917,940

(22) Filed: Mar. 12, 2018

(51) Int. Cl.
*H01L 21/8234* (2006.01)
*H01L 29/66* (2006.01)
*H01L 29/78* (2006.01)
*H01L 21/311* (2006.01)

(52) U.S. Cl.
CPC ........ *H01L 21/823437* (2013.01); *H01L 21/823481* (2013.01); *H01L 29/6653* (2013.01); *H01L 29/66545* (2013.01); *H01L 29/66795* (2013.01); *H01L 29/785* (2013.01); *H01L 21/31122* (2013.01)

(58) Field of Classification Search
CPC ..... H01L 21/823437; H01L 21/823481; H01L 21/31122; H01L 29/66795; H01L 29/6654
See application file for complete search history.

(56) References Cited

U.S. PATENT DOCUMENTS

| | | | |
|---|---|---|---|
| 9,064,932 B1 | 6/2015 | Pham et al. | |
| 9,293,459 B1 * | 3/2016 | Cheng | H01L 27/0886 |
| 9,431,399 B1 * | 8/2016 | Alptekin | H01L 27/0924 |
| 9,812,365 B1 | 11/2017 | Zhang et al. | |
| 2013/0049125 A1 | 2/2013 | Zhong et al. | |
| 2016/0365424 A1 * | 12/2016 | Basker | H01L 29/665 |
| 2017/0018628 A1 | 1/2017 | Greene et al. | |

* cited by examiner

*Primary Examiner* — Yosef Gebreyesus
(74) *Attorney, Agent, or Firm* — Francois Pagette; Hoffman Warnick LLC

(57) ABSTRACT

A gate cut structure for finFETs, and a related method, are disclosed. The gate cut structure separates and electrically isolates an end of a first metal gate conductor of a first finFET from an end of a second metal gate conductor of a second finFET. The gate cut structure includes a body contacting the end of the first and second metal gate conductors. A liner spacer separates a lower portion of the body from an interlayer dielectric (ILD), and an upper portion of the body contacts the ILD. During formation, the liner spacer allows for a larger gate cut opening to be used to allow quality cleaning of the gate cut opening, but also reduction in size of the spacing between metal gate conductor ends of the finFETs. In one example, the body may have a lower portion having a width less than an upper portion thereof.

9 Claims, 8 Drawing Sheets

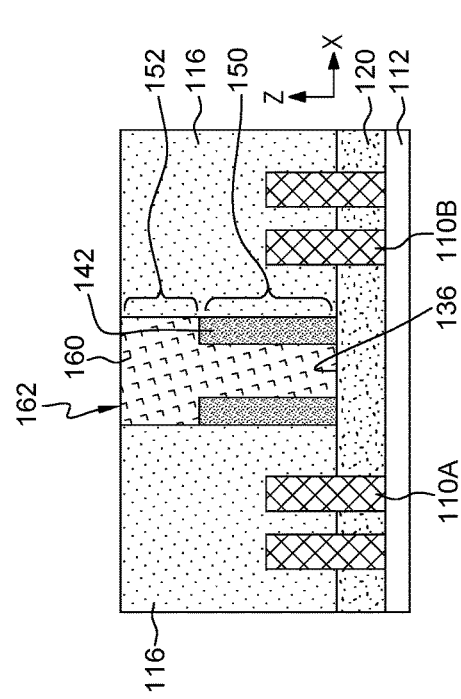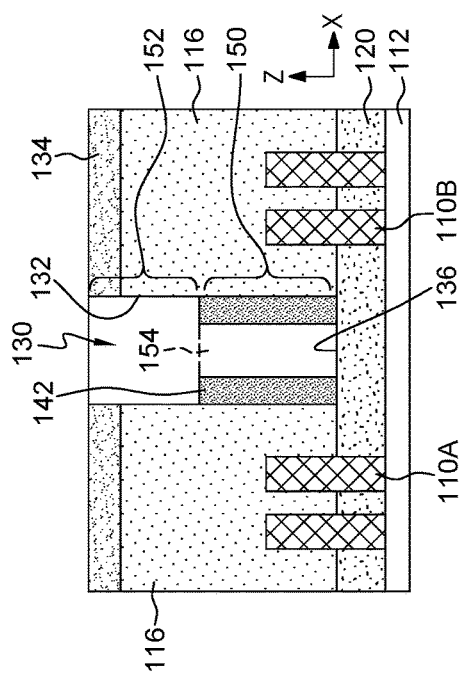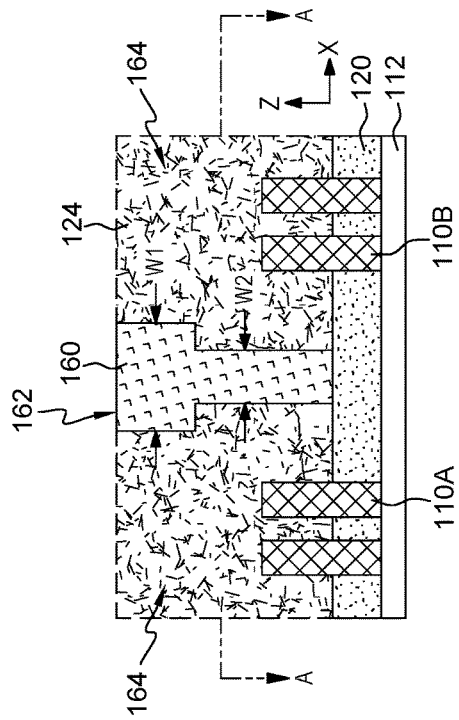

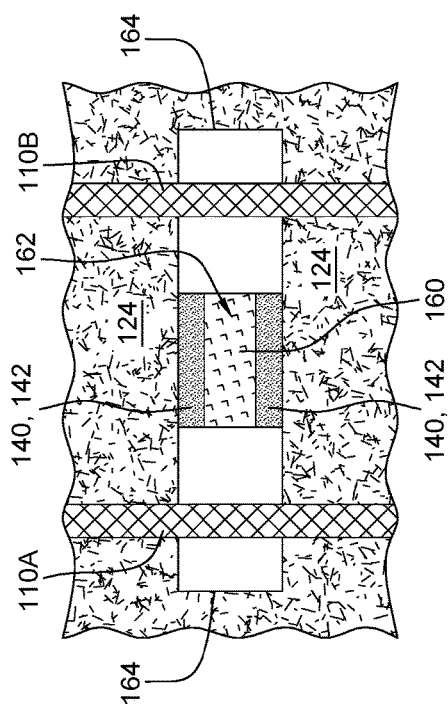
FIG. 10
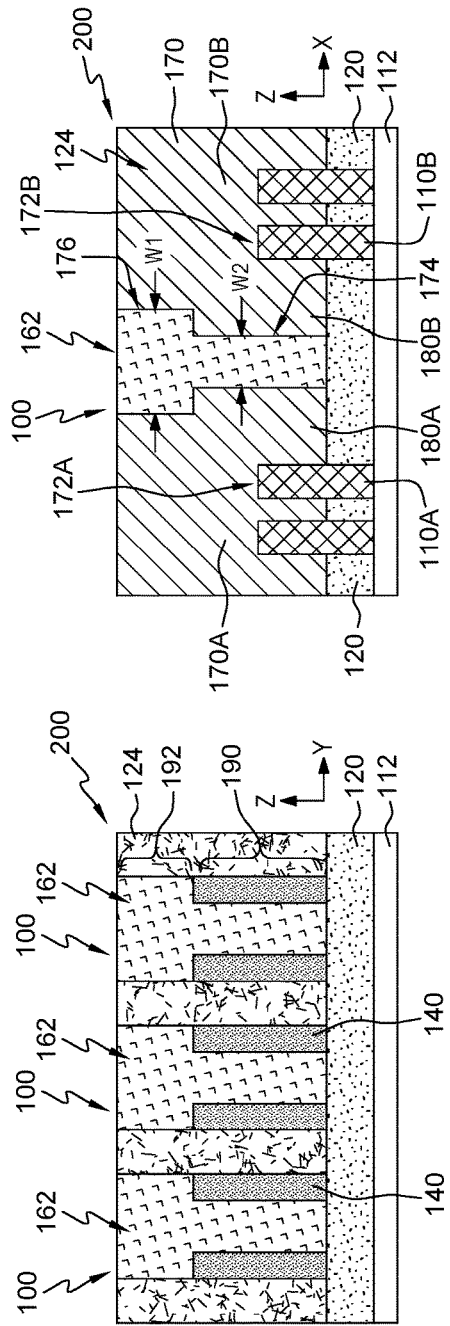
FIG. 11
FIG. 12

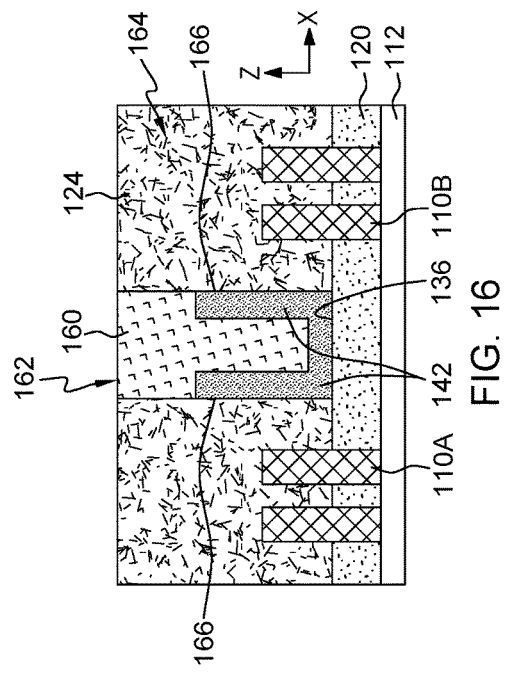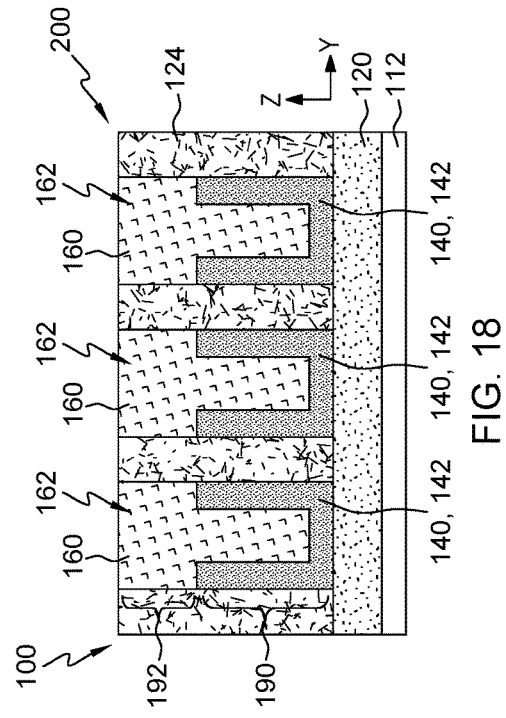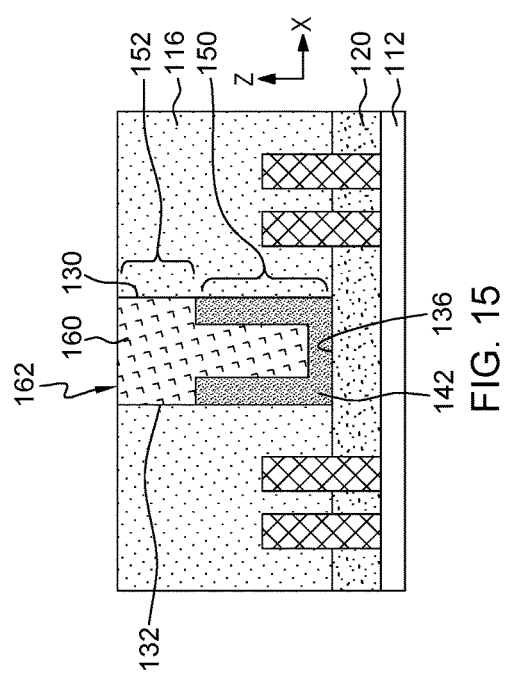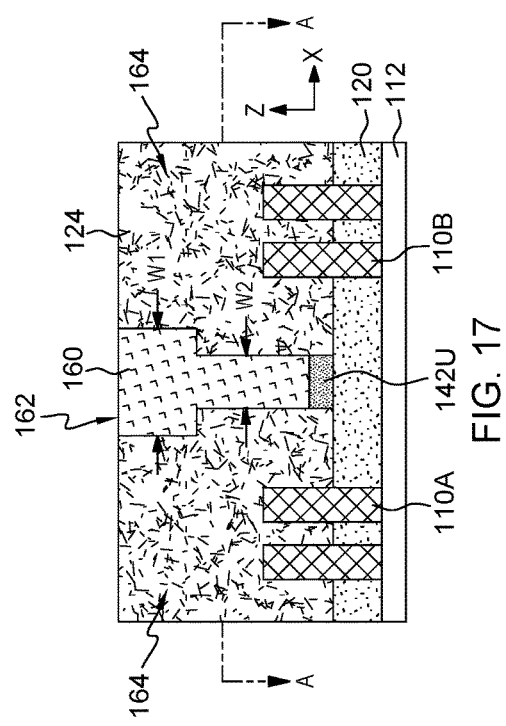

GATE CUT STRUCTURE WITH LINER SPACER AND RELATED METHOD

BACKGROUND

The present disclosure relates to integrated circuit (IC) fabrication, and more specifically, to gate cut structure for a pair of finFETs using a liner to allow for a smaller critical dimension.

Fin-type field effect transistor (finFETs) are formed by creating a number of semiconductor fins on a substrate and placing a gate conductor perpendicularly across the fins. A finFET is created by the gate forming a channel region below the gate in the fin, and source/drain regions formed in the fin aside the gate. In order to form the various portions of the finFET according to a replacement metal gate (RMG) approach, an elongated dummy gate is put in place where the metal gate conductor will eventually be placed perpendicularly across the fins. The dummy gate allows for processing such as anneals to be carried out without damaging the final gate conductor material. Spaces between the dummy gates and fins are filled with an interlayer dielectric. The dummy gates are typically made of polysilicon or amorphous silicon with a liner spacer such as titanium nitride. As part of the process, a gate cut opening is formed in the dummy gate, and is then filled with a gate cut fill. To form the finFETs, the dummy gate is removed, and replaced with a metal gate conductor that extends over adjacent fins. The gate cut fill creates a structure that provides an electrical isolation between gates of adjacent finFETs to electrically isolate the finFETs.

As integrated circuit (IC) fabrication continues to scale to smaller technology nodes, e.g., 7 nanometers and beyond, spacing between structures continues to decrease. For example, ground rules and pattern variability lead to extremely tight spacing for gate cut openings during finFET formation. A particular challenge with forming the gate cut is creating the opening with the desired size. For example, the width for a current gate cut opening is typically about 30 nanometers (nm), which allows sufficient space to remove any residue from the opening. However, that size is becoming too large for 7 nm technology node finFETs. That is, the gate cut fill size needs to be smaller than 30 nm to provide sufficient spacing, and to ensure metal gate conductor separation after metal conductor replacement in a 7 nm technology node. More specifically, in the 7 nm technology node, the amorphous silicon and liner spacer pinch off in a narrow gate cut, making it very difficult to remove the amorphous silicon residue at the bottom of the opening with the conventional reactive ion etch (RIE). In one approach, a high bias power RIE overetch is applied, but this etch creates bowed sidewalls in the gate cut opening, which can create shorts with the gate conductor ends. This approach creates an ion shadowing effect in other processes, and allows for oxygen gouging that may eventually contribute to interconnect issues.

SUMMARY

A first aspect of the disclosure is directed to a method, comprising: forming a first and second semiconductor fin on a substrate, a space separating the first and second semiconductor fins; forming a dummy gate extending over each of the first and second semiconductor fins; forming an interlayer dielectric about the first and second semiconductor fins and the dummy gate; forming a gate cut opening in the dummy gate in the space between the first and second semiconductor fins, the gate cut opening having an interior sidewall surface; forming a liner spacer layer in the gate cut opening, the liner spacer layer covering at least the interior sidewall surface of the gate cut opening; filling the gate cut opening with a gate cut fill, thus creating a gate cut body; removing the dummy gate, creating a dummy gate opening exposing outer sides of the liner spacer layer on the gate cut fill, and exposing the first semiconductor fin and the second semiconductor fin; forming a liner spacer between the gate cut body and the interlayer dielectric by removing the liner spacer layer that is exposed in the dummy gate opening from the gate cut fill; and forming a metal gate conductor in the dummy gate opening and over the first and second semiconductor fins, wherein the gate cut body isolates the metal gate conductor over the first semiconductor fin from the metal gate conductor over the second semiconductor fin. A second aspect of the disclosure includes a fin-type field effect transistor (finFET) structure, comprising: a substrate; a first finFET on the substrate, the first finFET having a first semiconductor fin and a first metal gate conductor over the first semiconductor fin; a second finFET on the substrate, the second finFET having a second semiconductor fin and a second metal gate conductor over the second semiconductor fin; an interlayer dielectric about the first finFET and the second finFET; and a gate cut structure electrically isolating an end of the first metal gate conductor from an end of the second metal gate conductor to electrically isolate the first and second finFETs, wherein the gate fill structure includes a body and a liner spacer, wherein the body has a lower portion and an upper portion, wherein the upper portion of the body contacts the interlayer dielectric and the liner spacer separates the lower portion of the body from the interlayer dielectric.

A third aspect of the disclosure related to a gate cut structure for fin-type field effect transistors (finFET), the gate cut structure comprising: a gate cut structure electrically isolating an end of a first metal gate conductor of a first finFET from an end of a second metal gate conductor of a second finFET, wherein the gate cut structure includes a body contacting the end of the first metal gate conductor and the end of the second metal gate conductor, and a liner spacer separating only a portion of the body from an interlayer dielectric extending about the first and second finFETs.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIGS. 4-6 show cross-sectional views along cross-section view line Y-Y in FIG. 1 of methods of modifying a liner spacer layer according to a first embodiment of the disclosure.

FIGS. 7-9 show cross-sectional views along cross-section view line Y-Y in FIG. 1 of forming a gate cut structure according to the first embodiment of the disclosure.

FIG. 10 shows a cross-sectional view along cross-section view line A-A in FIGS. 9, 17 and 23 of a dummy gate opening according to embodiments of the disclosure.

FIG. 11 shows a cross-sectional view along cross-section view line X-X in FIG. 1 of methods of forming a gate cut structure according to the first embodiment of the disclosure.

FIG. 12 shows a cross-sectional view along cross-section view line Y-Y in FIG. 1 of methods of forming gates according to the first embodiment of the disclosure.

FIGS. 15-17 show cross-sectional views along cross-section view line Y-Y in FIG. 1 of methods of forming a gate cut structure according to a second embodiment of the disclosure.

FIG. 18 shows a cross-sectional view along cross-section view line X-X in FIG. 1 of methods forming a gate cut structure according to the second embodiment of the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide a gate cut structure for finFETs, a related finFET structure, and a related method. The gate cut structure separates and electrically isolates an end of a first metal gate conductor of a first finFET from an end of a second metal gate conductor of a second finFET. The gate cut structure includes a body contacting the end of the first metal gate conductor and the end of the second metal gate conductor, and a liner spacer separating only a portion of the body, e.g., a lower portion, from an interlayer dielectric extending about the first and second finFETs. During formation using a replacement metal gate (RMG) process, a gate cut opening can be sized in a dummy gate to allow quality cleaning of the gate cut opening, e.g., to remove residue. Thereafter, the liner spacer layer can be employed to reduce the size of the spacing in at least a lower portion of the gate cut opening between metal gate conductor ends of the finFETs. In this manner, a quality gate cut structure can be formed but with a smaller spacing between metal gate conductors that replace the dummy gate to accommodate spacing in the 7 nanometer technology node and beyond. In one example, the body may have a lower portion having a width (e.g., less than or equal to approximately 24 nanometers) less than an upper portion of the body.

Figure 1:
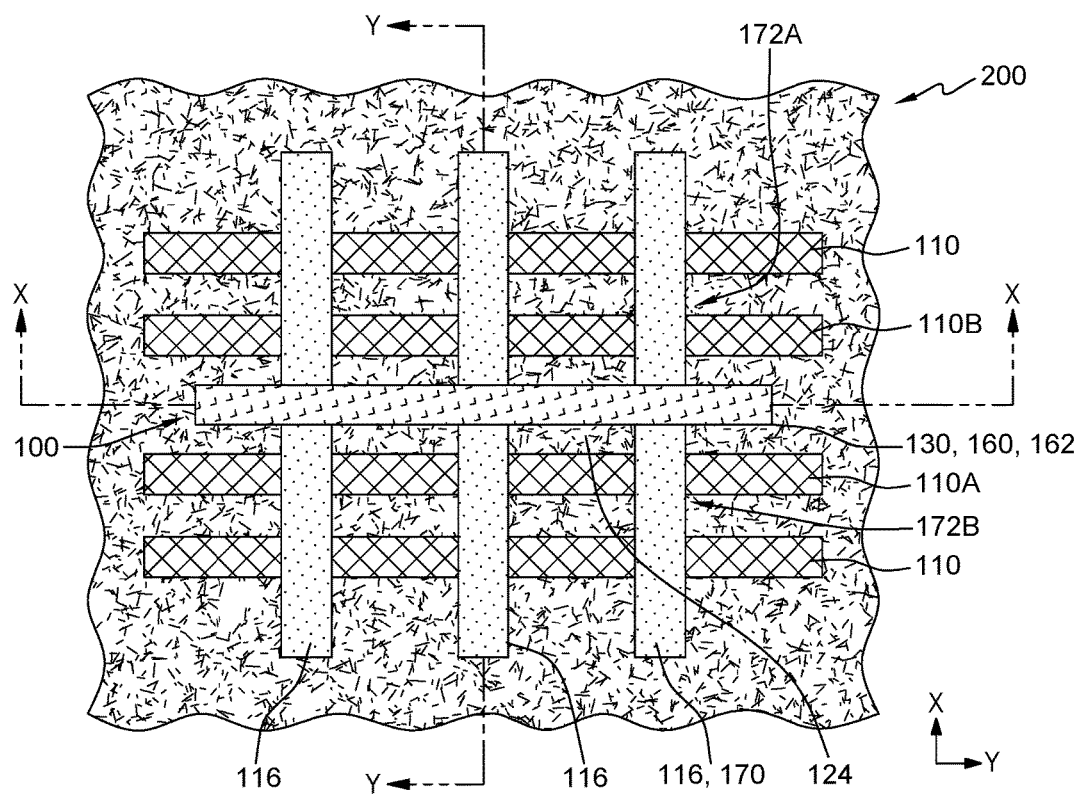
FIG. 1 shows a plan view of a general layout in which a gate cut structure is formed and used according to embodiments of the disclosure.
Figure 2:
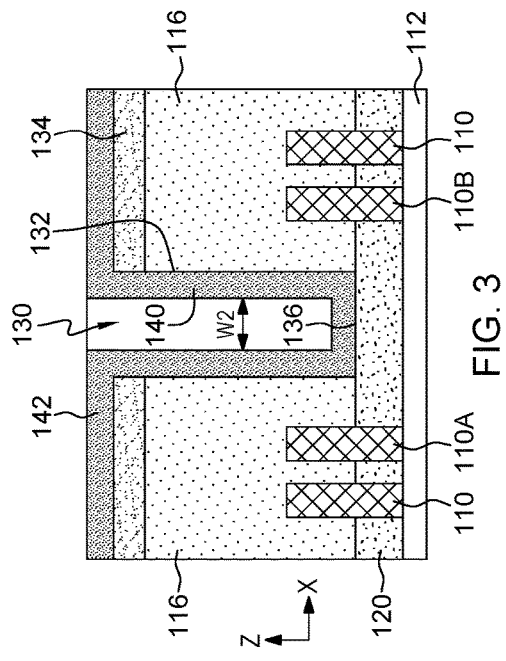
FIGS. 2 and 3 show cross-sectional views along cross-section view line Y-Y in FIG. 1 of methods of forming a gate cut opening and liner spacer layer according to embodiments of the disclosure.
Figure 3:
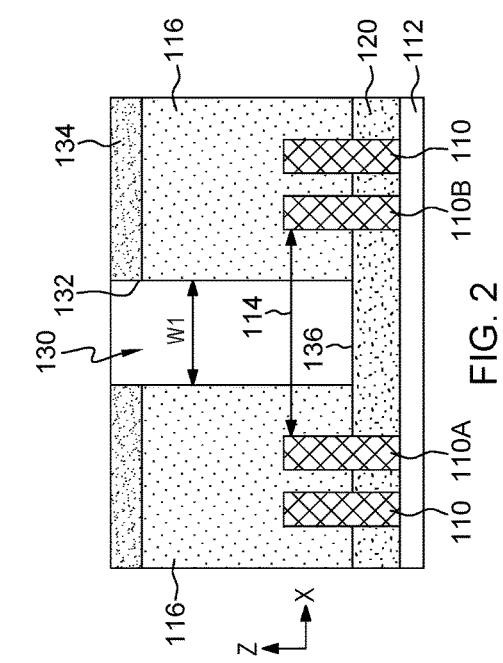

Referring to the drawings, embodiments of a method of forming a gate cut structure 100 will now be described. For purposes of description, FIG. 1 shows a plan view of a general layout in which gate cut structure 100 is formed and used. FIG. 1 includes a cross-section view line X-X in an X-direction per the legend, and a cross-section view line Y-Y in a Y-direction per the legend. It is noted that FIG. 1 shows certain structure that may take the form of different things during the methods described herein, e.g., the center rectangle may be a gate cut opening 130, a gate cut fill 160 or a gate cut body 162. FIGS. 2 and 3 show cross-sectional views along cross-section view line Y-Y in FIG. 1.

Preliminarily, as shown in FIGS. 2 and 3, the method includes forming a first and second semiconductor fin 110 on a substrate 112. Fins 110 run in a Y-direction in the drawings. Substrate 112 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. Semiconductor fins 110 may include any of the listed materials for substrate 112. Semiconductor fins 110 may be made using any now known or later developed technique, e.g., epitaxially growing the fins from substrate 112, or etching the fins from substrate 112. Although numerous fins 110 are shown, a first semiconductor fin 110A and a second semiconductor fin 110B will be referenced for purposes of description of the disclosure.

As shown best in FIG. 2, a space 114 separates first and second semiconductor fins 110A, 110B. A shallow trench isolation (STI) 120 may also be formed in or on substrate 112 to electrically isolate semiconductor fins 110A, 110B. Generally, STI 120 can be formed by depositing an insulating material into a trench in substrate 112 or on substrate 112 to isolate fins from one another. One or more finFETs of a given polarity may be disposed within an area isolated by STI 120. Each STI 120 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

FIGS. 2 and 3 also show forming a dummy gate(s) 116 extending over each of first and second semiconductor fins 110A, 110B. Dummy gates 116 extend in an X-direction in the drawings. Dummy gate 116 may include any now known or later developed sacrificial material for such use, e.g., polysilicon or an amorphous silicon. As shown in FIG. 1, dummy gate 116 crosses over many fins 110. As understood in the field, dummy gate 116 is employed to hold a place for a later formed metal gate conductor (170 in FIGS. 12, 19 and 25) that will replace it. Dummy gate 116 is used in place of a metal gate conductor to prevent damage to the metal gate conductor during certain processing, e.g., dopant anneals used to form source/drain regions in semiconductor fins 110. Once the potentially damaging processing is complete (typically occurs before processing according to the disclosure), as will be described, dummy gate 116 is removed and replaced with a metal gate conductor that forms the final gate of the finFETs. Dummy gate 116 may be formed using any now known or later developed technique. For example, dummy gate 116 material may be deposited, patterned and etched to remove extraneous material.

"Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Dummy gate 116 material may be deposited, for example, using ALD.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. Dummy gates 116 may be etched, for example, using RIE.

Returning to FIG. 1, an interlayer dielectric (ILD) 124 is formed about first and second semiconductor fins 110A, 110B and dummy gate 116. That is, ILD 124 fills the spaces between first and second semiconductor fins 110 and dummy gate 116. ILD 124 is behind and in front of dummy gate 116 in FIGS. 2-3 (into page and out of page). ILD 124 may include but is not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning). ILD 124 may be deposited using any appropriate deposition technique, e.g., ALD.

Continuing with FIG. 2, forming a gate cut opening 130 in dummy gate 116 in space 114 between first and second semiconductor fins 110A, 110B, is shown. Gate cut opening 130 has an interior sidewall surface 132. Gate cut opening 130 may be formed using any now known or later developed technique. For example, a hard mask 134 (e.g., of silicon nitride) may be formed and patterned, and gate cut opening 130 etched, e.g., using a RIE. Gate cut opening 130 may have a width W1 (shown across page, but similarly into page) sufficient to perform conventional cleaning of a bottom surface 136 of gate cut opening 130 after forming of gate cut opening 130. The cleaning may remove dummy gate 116 residue (e.g., polysilicon or amorphous silicon) from bottom surface 136 of gate cut opening. Width W2 may be, for example, approximately 30 nanometers. The cleaning can include any now known or later developed ashing process appropriate for dummy gate 116 material.

Conventionally, at this stage, gate cut opening 130 would be filled with a gate cut fill such as silicon nitride. As noted, gate cut opening 130 is larger than desired for the 7 nanometer technology node and beyond. According to embodiments of the disclosure, as will be described hereafter, a liner spacer layer 142 (see e.g., FIGS. 4-8) is created that allows for reducing the size of gate cut opening 130, and thus a size of gate cut fill 160 (FIG. 7) that will eventually electrically isolate ends of metal gate conductors for adjacent finFETs.

As shown in FIG. 3, a liner spacer layer 142 is deposited in gate cut opening 130, e.g., using ALD. As shown, liner spacer layer 142 covers at least interior sidewall surface 132 of gate cut opening 130, and typically also covers a bottom surface 136 of gate cut opening 130. Liner spacer layer 142 may also be deposited across dummy gate 116 (and ILD 124, not shown). Liner spacer layer 142 may include, for example, hafnium oxide ($HfO_2$), titanium oxide ($TiO_2$) or aluminum oxide ($Al_2O_3$). Liner spacer layer 142 may have a thickness, for example, in a range of approximately 5 nm to approximately 10 nm. As shown in FIG. 3, liner spacer layer 142 narrows a width W2 of gate cut opening 130 to, for example, less than or equal to approximately 24 nanometers. In one particular example, with a gate cut opening 130 width W1 (FIG. 2), depositing liner spacer layer 142 having an approximately 5 nanometer thickness creates a width W2 of approximately 20 nanometers, i.e., 30 nm–(2×5) nm. In another example, depositing liner spacer layer 142 having an approximately 10 nanometer thickness creates a width W2 of approximately 10 nanometers, i.e., 30 nm–(2×10) nm. As will be described, width W2 is used to define a size of gate cut structure 100 (FIGS. 1, 12, 19 and 25) that electrically isolates metal gate conductors of adjacent finFETs. Liner spacer layer 142 thickness can be customized to create a desired width W2 for gate cut opening 130.

Liner spacer layer 142 can be modified in a number of ways to create a variety of different liner spacers 140 (see, e.g., FIGS. 1, 11-12, 18-19 and 24-25), i.e., prior to depositing a gate cut fill 160 in gate cut opening 130. One embodiment for modifying liner spacer layer 142 is shown in FIGS. 4-12.

Figure 4:
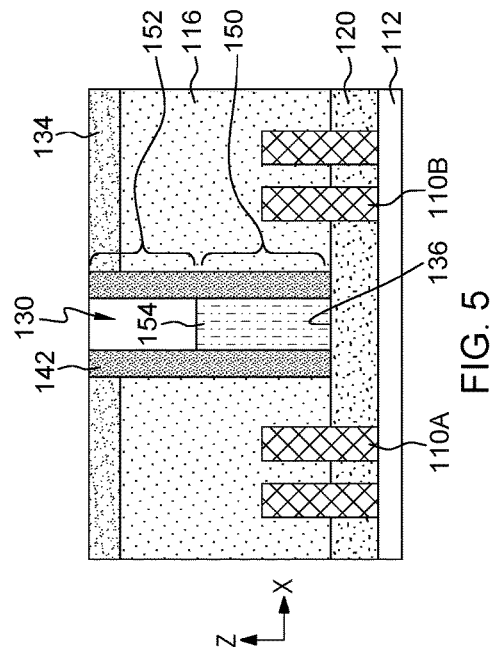
Figure 5:
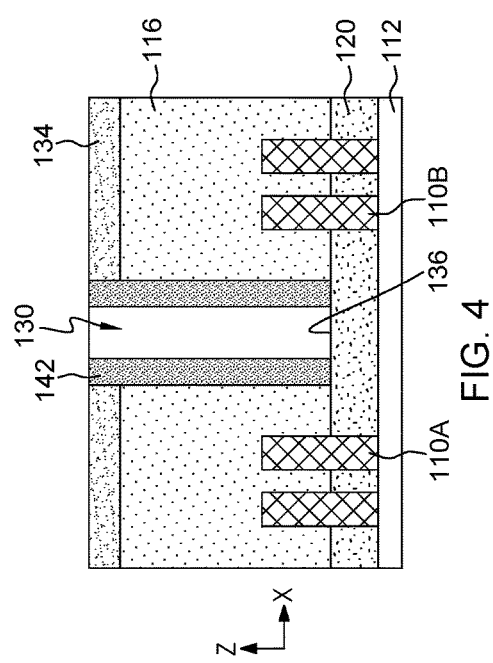

FIGS. 4-6 show cross-sectional views along cross-section view line Y-Y in FIG. 1. In this embodiment, as shown in FIG. 4, liner spacer layer 142 may be etched from bottom surface 136 of gate cut opening 130. This etch may include, for example, a dry etch appropriate for liner spacer layer 142 material, e.g., a RIE for hafnium oxide ($HfO_2$). As shown, this etch may also remove liner spacer layer 142 from over dummy gate 116 and ILD 124 (FIG. 1). FIG. 5 shows filling a lower portion 150 of gate cut opening 130 with a sacrificial material 154, i.e., the part not already filled by liner spacer layer 142. The height (Z-direction) of lower portion 150 of gate cut opening 130 filled by sacrificial material 154 can be, for example, approximately 40 nanometers (nm) to approximately 100 nm. Sacrificial material 154 may be any now known or later developed soft material for place-filling during semiconductor processing such as but not limited to silicon oxide hybrid (SOH), or silicon oxide ($SiO_2$). FIG. 6 shows etching to remove liner spacer layer 142 from interior sidewall surface 132 of gate cut opening 130 above sacrificial material 154 (in phantom), i.e., on an upper portion 152 of gate cut opening 130. This etching may include any appropriate dry etch to remove liner spacer layer 142 but not sacrificial material 154, e.g., a fluorine or halogen based etch. FIG. 6 also shows another step of removing sacrificial material 154. This etch may include for example a wet etch appropriate for sacrificial material 154. This etch leaves liner spacer layer 142 along interior sidewall surface 132 of only lower portion 150 of gate cut opening 130.

FIGS. 7-12 show forming gate cut structure 100 (FIGS. 1, 11 and 12) using the FIGS. 4-6 embodiment. FIGS. 7-9 and 12 show cross-sectional views along cross-section view line Y-Y in FIG. 1, FIG. 10 shows a cross-sectional view along cross-section view line A-A in FIG. 9, and FIG. 11 shows a cross-sectional view along cross-section view line X-X in FIG. 1. FIG. 7 shows filling gate cut opening 130 with a gate cut fill 160, thus creating a gate cut body 162 of gate cut structure 100 (FIGS. 1, 11-12). Gate cut fill 160 may include, for example, silicon nitride ($Si_3N_4$), silicon oxynitride (SiON), silicon carbon nitride (SiCN), or silicon oxy-carbon-nitride (SiOCN). Gate cut opening 130 filling may include a planarization step to remove any additional material. Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This process removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

FIG. 8 shows removing dummy gate 116 (FIG. 7), creating a dummy gate opening 164 exposing outer sides 166 of liner spacer layer 142 on gate cut fill 160, and first semiconductor fin 110A and second semiconductor fin 110B. That is, dummy gate opening 164 exposes outer sides 166 of liner spacer layer 142 facing into the opening. In FIG. 8, with dummy gate opening 164 present, ILD 124 is viewable. Dummy gate 116 may be removed using, for example, a hydrochloric (HCl) dry etch or a RIE for amorphous silicon, or a hot ammonia ($NH_3$) wet etch for polysilicon, or any now known or later developed etch process appropriate for dummy gate 116 material.

FIGS. 9-11 show forming liner spacer 140 (FIG. 11) between gate cut body 162 and ILD 124 by removing liner spacer layer 142 that is exposed in dummy gate opening 164 from gate cut fill 160. This process may include any now known or later developed etch process appropriate for liner spacer layer 142 material, e.g., a RIE for hafnium oxide ($HfO_2$), titanium oxide ($TiO_2$), or aluminum oxide ($Al_2O_3$). As observed by comparing FIGS. 8 and 9, this etch acts on exposed outer sides 166 of liner spacer layer 142 towards gate cut fill 160 to remove liner spacer layer 142 from gate cut body 162. However, as shown in the cross-sectional view of FIG. 11 (along cross-section view line Y-Y of FIG. 1) and the cross-sectional view of FIG. 10 along cross-section view line A-A in FIG. 9, the etch does not impact liner spacer layer 142 between gate cut body 162 and ILD 124. The remaining liner spacer layer 142 between gate cut body 162 and ILD 124 creates liner spacer 140. Liner spacer 140 is between only a portion of body 162, i.e., a lower portion 190 (FIG. 11), and ILD 124.

FIG. 12 shows a cross-sectional view along cross-section view line Y-Y in FIG. 1 in which a metal gate conductor 170 is formed in dummy gate opening 164 (FIG. 9) and over first and second semiconductor fins 110A, 110B. Metal gate conductor 170 formation may include deposition of any now known or later developed metal conductor, e.g., copper, in a conventional fashion. Any necessary and conventional gate dielectric material (not shown) may be also formed over semiconductor fins 110A, 110B as part of the metal gate conductor 170 formation. Further, any conventional liner materials (not shown) between metal gate conductor 170 and, for example, ILD 124, may also be formed as part of this process. A planarization step may be performed to remove unnecessary metal from an upper surface of the structure. As shown in FIG. 12, gate cut body 162 of gate cut structure 100 isolates metal gate conductor 170A over first semiconductor fin 110A from metal gate conductor 170B over second semiconductor fin 110B. As understood, with the formation of source/drains (not shown) in semiconductor fins 110A, 110B, metal gate conductor 170A over first semiconductor fin 110A forms a first finFET 172A, and metal gate conductor 170B over second semiconductor fin 110B forms a second finFET 172B. As understood, each finFET 172A, 172B may include more than one semiconductor fin 110. A lower portion 174 of gate cut body 162 of gate cut structure 100 may have a width W2 less than or equal to, for example, approximately 24 nanometers, which is smaller than what current processes allow. An upper portion 176 of gate cut body 162 of gate cut structure 100 may have a width greater than, for example, approximately 24 nanometers, i.e., as would be desired to allow for cleaning of gate cut opening 130 (FIG. 2).

Referring to FIGS. 13-19, another embodiment of modifying liner spacer layer 142 prior to depositing gate cut fill 160 in gate cut opening 130 is shown. The process of FIG. 13 occurs after FIG. 3.

Figure 14:
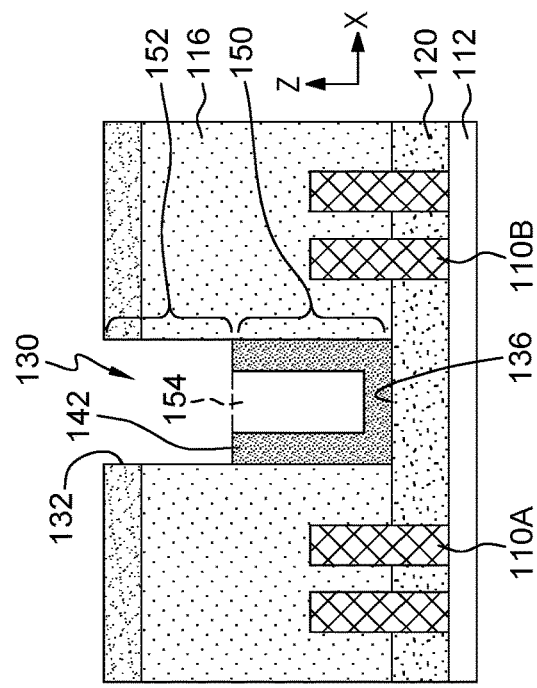
FIGS. 13-14 show cross-sectional views along cross-section view line Y-Y in FIG. 1 of methods of modifying a liner spacer layer according to a second embodiment of the disclosure.
Figure 13:
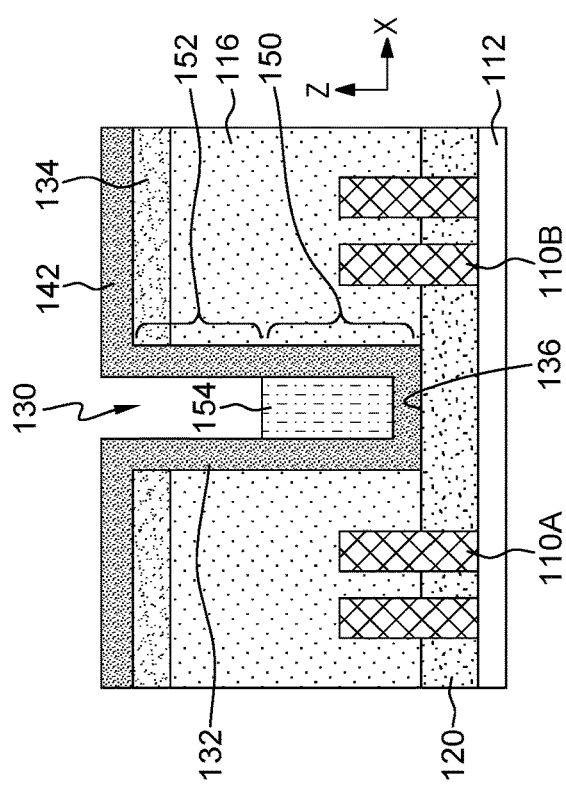

FIGS. 13-14 show cross-sectional views along cross-section view line Y-Y in FIG. 1. In this embodiment, as shown in FIG. 13, in contrast to the previous embodiment, liner spacer layer 142 is not etched from bottom surface 136 of gate cut opening 130. FIG. 13 shows filling lower portion 150 of gate cut opening 130 with sacrificial material 154. The height (Z-direction) of lower portion 150 of gate cut opening 130 can be, for example, approximately 40 nm to approximately 100 nm. As noted, sacrificial material 154 may be any now known or later developed soft material for place filling during semiconductor processing such as but not limited to silicon oxide hybrid (SOH), or silicon oxide ($SiO_2$). FIG. 14 shows etching to remove liner spacer layer 142 from interior sidewall surface 132 of gate cut opening 130 above sacrificial material 154 (in phantom), i.e., on upper portion 152 of gate cut opening 130. This etching may include any appropriate dry etch to remove liner spacer layer 142 but not sacrificial material 154, e.g., a fluorine or halogen based etching. FIG. 14 also shows removing the sacrificial material 154. This etch may include for example a wet etch appropriate for sacrificial material 154. This etch leaves liner spacer layer 142 on lower portion 150 of interior sidewall surface 132 of gate cut opening 130, and bottom surface 136 of gate cut opening 130. That is, on bottom surface 136 and along interior sidewall surface 132 of only lower portion 150 of gate cut opening 130.

Figure 19:
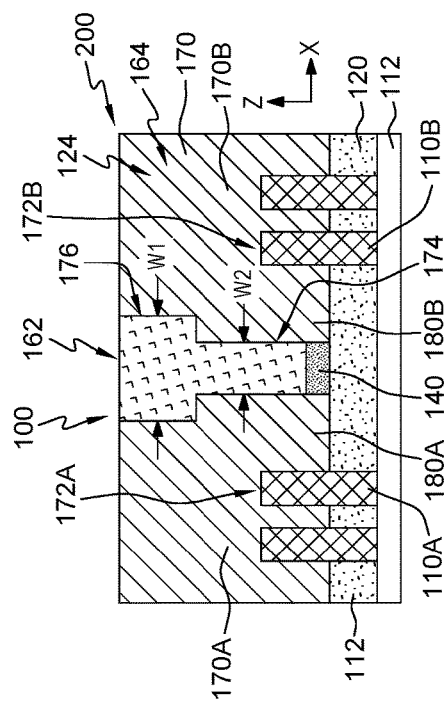
FIG. 19 shows a cross-sectional view along cross-section view line Y-Y in FIG. 1 of methods forming gates according to the second embodiment of the disclosure.

FIGS. 15-19 show forming gate cut structure 100 (FIGS. 1, 18 and 19) using the FIGS. 13-14 embodiment. FIGS. 15-17 and 19 show cross-sectional views along cross-section view line Y-Y in FIG. 1, and FIG. 18 shows a cross-sectional view along cross-section view line X-X in FIG. 1. FIG. 15 shows filling gate cut opening 130 with gate cut fill 160, forming gate cut body 162 of gate cut structure 100 (FIGS. 1, 18 and 19). Gate cut fill 160 may include, for example, silicon nitride ($Si_3N_4$), silicon oxynitride (SiON), silicon carbon nitride (SiCN), or silicon oxy-carbon-nitride (SiOCN). Gate cut opening 130 filling may include a planarization step to remove any additional material.

FIG. 16 shows removing dummy gate 116 (FIG. 15), creating dummy gate opening 164 exposing outer sides 166 of liner spacer layer 142 on gate cut fill 160, and first semiconductor fin 110A and second semiconductor fin 110B. That is, dummy gate opening 164 exposes outer sides 166 of liner spacer layer 142 facing into the opening. In FIG. 16, ILD 124 is viewable.

FIGS. 17-19 show forming liner spacer 140 (FIGS. 18 and 19) between gate cut body 162 and ILD 124 by removing liner spacer layer 142 that is exposed in dummy gate opening 164 from gate cut fill 160. This process may include any now known or later developed etch process appropriate for liner spacer layer 142 material, e.g., a RIE for hafnium oxide ($HfO_2$), titanium oxide ($TiO_2$), or aluminum oxide ($Al_2O_3$). As observed by comparing FIGS. 16 and 17, this etch acts on exposed outer sides 166 of liner spacer layer 142 towards gate cut fill 160 to remove liner spacer layer 142 from gate cut body 162. However, as shown in the cross-sectional view of FIG. 18 (along cross-section view line X-X of FIG. 1) and the cross-sectional view of FIG. 10 (in addition to FIG. 9, this view matches the structure shown along cross-section view line A-A in FIG. 17), the etch does not impact liner spacer layer 142 between gate cut body 162 and ILD 124. Furthermore, the etch does not impact a liner spacer layer 142U (FIG. 17) under gate cut body 162, i.e., between gate cut body 162 and STI 120. That is, removing exposed outer sides 166 of liner spacer layer 142 from gate cut fill 160 leaves liner spacer layer 142U (FIG. 17) underneath gate cut fill 160, and over STI 120. The remaining liner spacer layer 142 between gate cut body 162 and ILD 124 and the remaining liner spacer layer 142U (FIG. 17) between gate cut body and STI 120, create liner spacer 140.

FIG. 19 shows a cross-sectional view along cross-section view line Y-Y in FIG. 1 in which metal gate conductor 170 is formed in dummy gate opening 164 (FIG. 17) and over first and second semiconductor fins 110A, 110B. Metal gate conductor 170 formation may include any of the processes described relative to FIG. 12. As shown in FIGS. 18 and 19, gate cut fill structure 100 has substantially the same structure as that shown in FIG. 12, except as shown in FIG. 19, liner spacer 140 also extends under gate cut body 162. That is, liner spacer 140 extends along lower portion 150 (FIG. 18) of a side of gate cut fill 160, and underneath gate cut fill 160 (FIG. 18).

Referring to FIGS. 20-25, another embodiment of modifying liner spacer layer 142 prior to depositing gate cut fill 160 in gate cut opening 130 is shown. The process of FIG. 20 occurs after FIG. 3.

Figure 20:
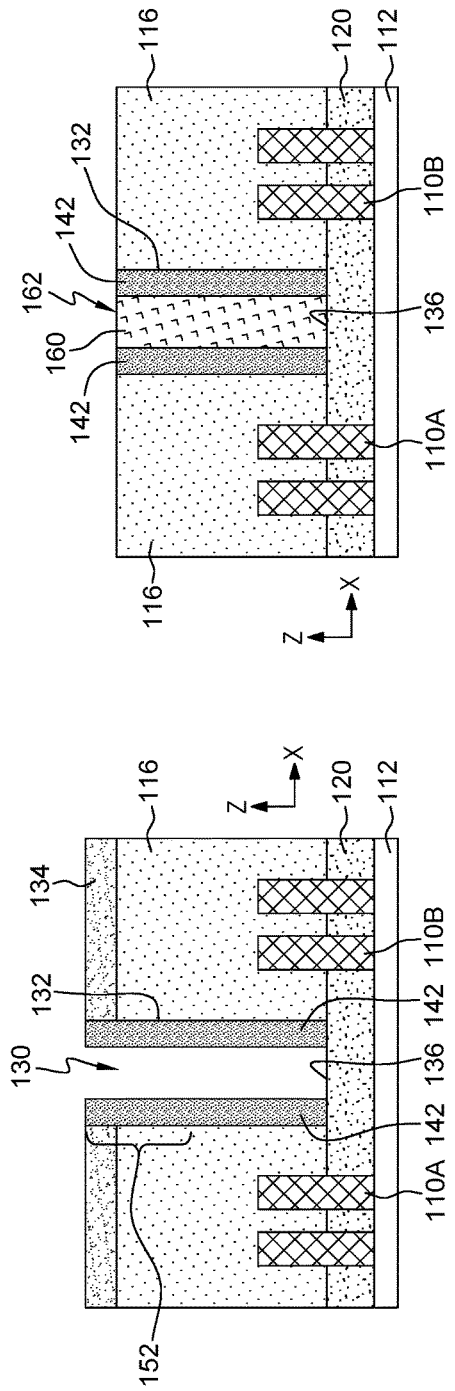
FIG. 20 shows a cross-sectional view along cross-section view line Y-Y in FIG. 1 of methods of modifying a liner spacer layer according to a third embodiment of the disclosure.

FIG. 20 shows a cross-sectional view along cross-section view line Y-Y in FIG. 1. In this embodiment, liner spacer layer 142 is etched from bottom surface 136 of gate cut opening 130. Here, in contrast to the first couple of embodiments, liner spacer layer 142 is not removed from upper portion 152 of gate cut opening 130, and no sacrificial material 154 is formed in gate cut opening 130. That is, liner spacer layer 142 is left along interior sidewall surface 132 of gate cut opening 130. This etching may include any appropriate dry etch to remove liner spacer layer 142 from bottom surface 136, e.g., a fluorine or halogen based etching. Liner spacer layer 142 extends the entire (Z) height of gate cut opening 130.

Figure 21:
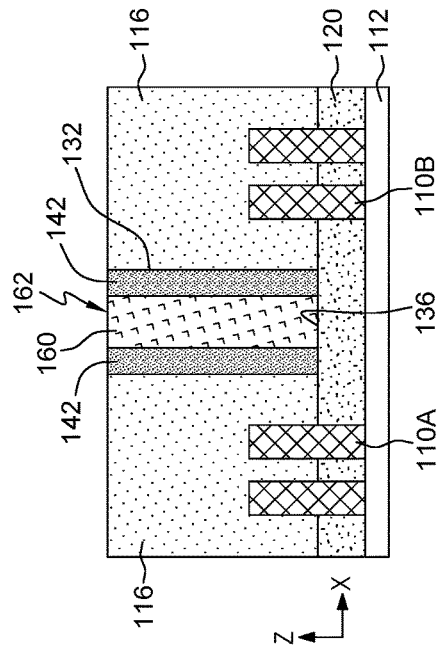
FIGS. 21-23 show cross-sectional views along cross-section view line Y-Y in FIG. 1 of methods of forming a gate cut structure according to a third embodiment of the disclosure.
Figure 22:
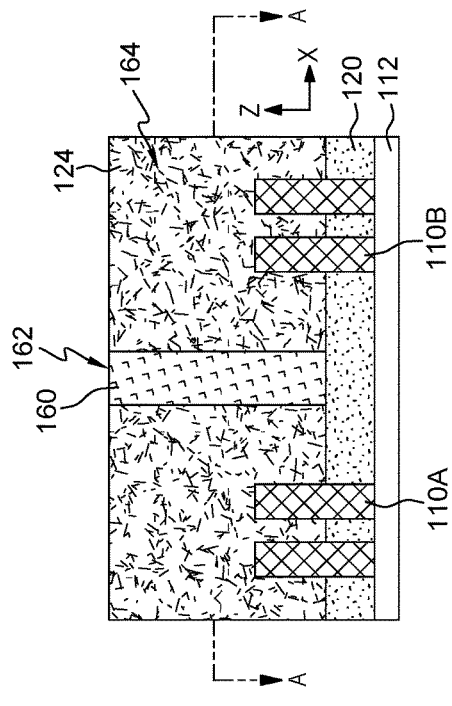
Figure 23:
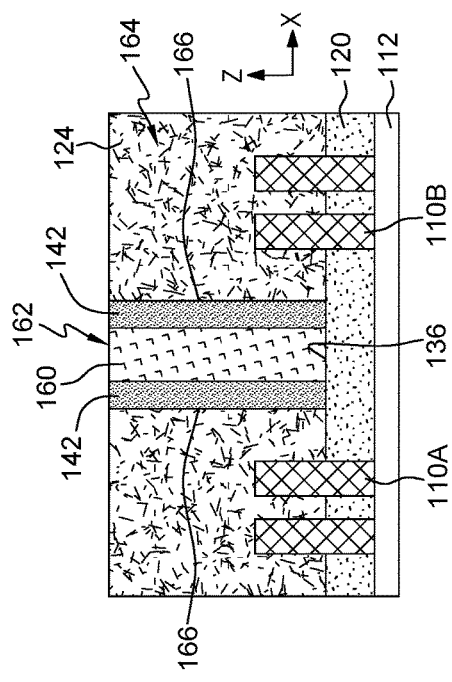
Figure 24:
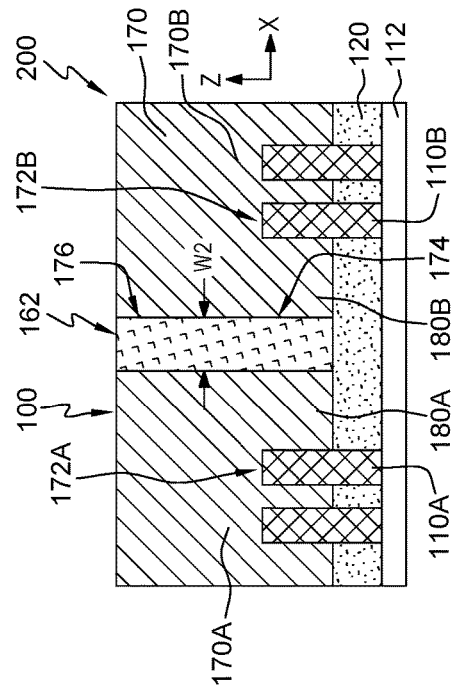
FIG. 24 shows a cross-sectional view along cross-section view line X-X in FIG. 1 of methods of forming a gate cut structure according to the third embodiment of the disclosure.
Figure 25:
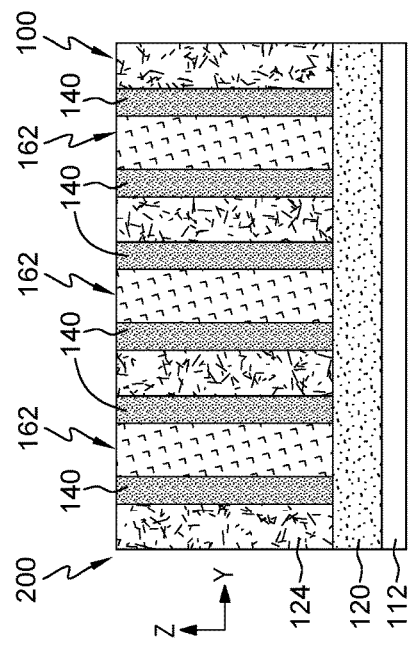
FIG. 25 shows a cross-sectional view along cross-section view line Y-Y in FIG. 1 of methods of forming gates according to the third embodiment of the disclosure.

FIGS. 21-25 show forming gate cut structure 100 (FIGS. 1, 24 and 25) using the FIG. 20 embodiment. FIGS. 21-23 and 25 show cross-sectional views along cross-section view line Y-Y in FIG. 1, and FIG. 24 shows a cross-sectional view along cross-section view line X-X in FIG. 1. FIG. 21 shows filling gate cut opening 130 with gate cut fill 160, forming gate cut body 162 of gate cut structure 100 (FIGS. 1, 24 and 25). Gate cut fill 160 may include, for example, silicon nitride ($Si_3N_4$), silicon oxynitride (SiON), silicon carbon nitride (SiCN), or silicon oxy-carbon-nitride (SiOCN). Gate cut opening 130 filling may include a planarization step to remove any additional material. FIG. 22 shows removing dummy gate 116 (FIG. 21), creating dummy gate opening 164 exposing outer sides 166 of liner spacer layer 142 on gate cut fill 160, and first semiconductor fin 110A and second semiconductor fin 110B. That is, dummy gate opening 164 exposes outer sides 166 of liner spacer layer 142 facing into the opening. In FIGS. 22 and 23, with dummy gate opening 164 present, ILD 124 is viewable.

FIGS. 23-25 show forming liner spacer 140 (FIGS. 24 and 25) between gate cut body 162 and ILD 124 by removing liner spacer layer 142 that is exposed in dummy gate opening 164 from gate cut fill 160. This process may include any now known or later developed etch process appropriate for liner spacer layer 142 material, e.g., a RIE for hafnium oxide ($HfO_2$), titanium oxide ($TiO_2$), or aluminum oxide ($Al_2O_3$). As observed by comparing FIGS. 22 and 23, this etch acts on exposed outer sides 166 of liner spacer layer 142 towards gate cut fill 160 to remove liner spacer layer 142 from gate cut body 162. However, as shown in the cross-sectional view of FIG. 23 (along cross-section view line Y-Y of FIG. 1) and the cross-sectional view of FIG. 10 (in addition to FIGS. 9 and 17, this view matches the structure shown along cross-section view line A-A in FIG. 23), the etch does not impact liner spacer layer 142 between gate cut body 162 and ILD 124. The remaining liner spacer layer 142 between gate cut body 162 and ILD 124, create liner spacer 140.

FIG. 25 shows a cross-sectional view along cross-section view line Y-Y in FIG. 1 in which metal gate conductor 170 is formed in dummy gate opening 164 (FIG. 23) and over first and second semiconductor fins 110A, 110B. Metal gate conductor 170 formation may include any of the processes described relative to FIG. 12. As shown in FIGS. 24 and 25, gate cut fill structure 100 has substantially the same structure as that shown in FIG. 12, except as shown in FIG. 24, liner spacer 140 also extends the entire height of gate cut structure 100. That is, liner spacer 140 extends the entire height of gate cut fill 160 between gate cut fill 160 and ILD 124. Here, in contrast to the first couple of embodiments, gate cut fill 160 may have a width less than or equal to approximately 24 nanometers along its entire height.

FIGS. 1, 11-12, 18-19 and 24-25 shows a fin-type field effect transistor (finFET) structure 200 according to embodiments of the disclosure. FinFET structure 200 includes substrate 112 with a first finFET 172A on substrate 112 and a second finFET 172B on substrate 112. FIG. 1 shows ILD 124 about first finFET 172A and second finFET 172B to isolate the finFETs. As shown in FIGS. 12, 19 and 25, first finFET 172A has a first semiconductor fin 110A and a first metal gate conductor 170A over the first semiconductor fin, and second finFET 172B has a second semiconductor fin 110B and a second metal gate conductor 170B over the second semiconductor fin. Gate cut structure 100 electrically isolates an end 180A of first metal gate conductor 170A from an end 180B of second metal gate conductor 170B to electrically isolate first and second finFETs 172A, 172B. Gate cut structure 100 includes body 162 and liner spacer 140. Body 162 contacts end 180A of first metal gate conductor 170A and end 180B of second metal gate conductor 170B.

As shown in FIGS. 11 and 18, body 162 may have a lower portion 190 and an upper portion 192. In contrast to conventional structures, liner spacer 140 separates only a portion of body 162 and ILD 124, e.g., lower portion 190, not facing metal gate conductors 170A, 170B. An upper portion 192 of body 162 contacts ILD 124. That is, upper portion 192 of body 162 contacts ILD 124 and liner spacer 140 separates lower portion 190 of body 162 from ILD 124. Lower portion 190 of body 162 may have a width less than upper portion 192 of body 162. In one embodiment, lower portion 190 of body 162 may have a width less than or equal to, for example, approximately 24 nanometers to have body 162, e.g., comport with 7 nm technology node and beyond. Upper portion 192 of body 162 may have a width greater than, for example, approximately 24 nanometers, e.g., to allow residue cleaning of gate cut opening 130 during formation. It is emphasized that while a particular width has been described herein future technology may allow for smaller widths, which are considered within the scope of the disclosure. As best observed in FIGS. 12 and 19, body 162 of gate cut structure 100 may also have a cross-sectional T-shape. More specifically, a horizontal top of the cross-sectional T-shape may extend: over ends 180A, 180B of gate conductors 170A, 170B (in the XZ-plane, as shown in FIGS. 12 and 19), and over liner spacer 140 (in the YZ-plane, as shown in FIGS. 11 and 18). In other words, body 162 of gate cut structure 100 may have a pin-head cross-sectional shape.

In the FIG. 18 embodiment, liner spacer 140 extends underneath body 162, i.e., between body 162 and STI 120. In the FIG. 24 embodiment, body 162 has liner spacer 140 between the body and ILD 124 along an entire height of body 162. Here, all of body 162 may have a width W2 less than or equal to, for example, approximately 24 nanometers. Also, body 162 has the shape of an inner surface of liner spacer 140, e.g., generally cylindrical. As noted, liner spacer 140 may include, for example, hafnium oxide ($HfO_2$), titanium oxide ($TiO_2$) or aluminum oxide ($Al_2O_3$), and may have a thickness in a range of approximately 5 nm to approximately 10 nm.

Embodiments of the disclosure also include gate cut structure 100 for finFETs 172A, 172B. As noted, gate cut structure 100 electrically isolates end 180A of first metal gate conductor 170A of first finFET 172A from end 180B of second metal gate conductor 170B of second finFET 172B. Gate cut structure 100 includes body 162, e.g., of silicon nitride, contacting end 180A of first metal gate conductor 170A and end 180B of second metal gate conductor 170B. As shown in FIGS. 11 and 18 embodiments, gate cut structure 100 may also include liner spacer 140 separating lower portion 190 of body 162 from ILD 124 extending about first and second finFETs 172A, 172B. Liner spacer 140 acts to reduce the size of gate cut opening 130 to allow use for 7 nm technology node structures and beyond. In contrast to conventional structures, as noted, lower portion 190 may have a width W2 (e.g., less than or equal to approximately 24 nanometers) less than upper portion 192.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−5% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A fin-type field effect transistor (finFET) structure, comprising:
   a substrate;
   a first finFET on the substrate, the first finFET having a first semiconductor fin and a first metal gate conductor over the first semiconductor fin;
   a second finFET on the substrate, the second finFET having a second semiconductor fin and a second metal gate conductor over the second semiconductor fin;
   an interlayer dielectric about the first finFET and the second finFET; and
   a gate cut structure electrically isolating an end of the first metal gate conductor from an end of the second metal gate conductor to electrically isolate the first and second finFETs, wherein the gate cut structure includes a body and a liner spacer,
   wherein the body has a lower portion and an upper portion,
   wherein the upper portion of the body contacts the interlayer dielectric and the liner spacer separates the lower portion of the body from the interlayer dielectric.

2. The finFET structure of claim 1, wherein the upper portion and the lower portion of the body contacts the end of the first metal gate conductor and the end of the second metal gate conductor.

3. The finFET structure of claim 1, wherein the lower portion of the body has a width less than the upper portion of the body.

4. The finFET structure of claim 3, wherein the lower portion has a width less than or equal to approximately 24 nanometers.

5. The finFET structure of claim 1, wherein the liner spacer extends underneath the body.

6. The finFET structure of claim 1, wherein the body has a cross-sectional T-shape.

7. A gate cut structure for fin-type field effect transistors (finFET), the gate cut structure comprising:
   a gate cut structure electrically isolating an end of a first metal gate conductor of a first finFET from an end of a second metal gate conductor of a second finFET,
   wherein the gate cut structure includes a body contacting the end of the first metal gate conductor and the end of the second metal gate conductor, and a liner spacer separating only a portion of the body from an interlayer dielectric extending about the first and second finFETs.

8. The gate cut structure of claim 7, wherein the body has a lower portion and an upper portion, the lower portion having a width less than the upper portion.

9. The gate cut structure of claim 8, wherein the upper portion of the body contacts the interlayer dielectric and the liner spacer separates the lower portion of the body from the interlayer dielectric.

* * * * *